US011088138B2

(12) United States Patent
Lee et al.

(10) Patent No.: US 11,088,138 B2
(45) Date of Patent: Aug. 10, 2021

(54) SEMICONDUCTOR DEVICE FOR TESTING CHARACTERISTICS OF TRANSISTORS AND METHOD FOR TESTING SEMICONDUCTOR DEVICE

(71) Applicant: The Industry & Academic Cooperation in Chungnam National University (IAC), Daejeon (KR)

(72) Inventors: Hideok Lee, Daejeon (KR); Dongjun Oh, Daejeon (KR); Sungkyu Kwon, Daejeon (KR); Hyeongsub Song, Daejeon (KR); Soyeong Kim, Gyeonggi-do (KR)

(73) Assignee: THE INDUSTRY & ACADEMIC COOPERATION IN CHUNGNAM NATIONAL UNIVERSITY (IAC), Daejeon (KR)

( * ) Notice: Subject to any disclaimer, the term of this patent is extended or adjusted under 35 U.S.C. 154(b) by 135 days.

(21) Appl. No.: 16/204,867

(22) Filed: Nov. 29, 2018

(65) Prior Publication Data
US 2019/0172829 A1    Jun. 6, 2019

(30) Foreign Application Priority Data

Nov. 29, 2017 (KR) .................. 10-2017-0161803
Jan. 19, 2018 (KR) .................. 10-2018-0006979

(51) Int. Cl.
*H01L 27/092* (2006.01)
*H01L 23/528* (2006.01)
(Continued)

(52) U.S. Cl.
CPC ...... *H01L 27/0922* (2013.01); *G01R 31/2601* (2013.01); *G01R 31/2628* (2013.01);
(Continued)

(58) Field of Classification Search
CPC combination set(s) only.
See application file for complete search history.

(56) References Cited

U.S. PATENT DOCUMENTS 8,384,122 B1 * 2/2013 Hu .................. H01L 29/165
257/105
9,613,955 B1 * 4/2017 Anderson .......... H01L 27/0886
(Continued)

FOREIGN PATENT DOCUMENTS

JP      06160892 A   6/1994
KR    100390826 B1   6/2003
(Continued)

*Primary Examiner* — Nduka E Ojeh
(74) *Attorney, Agent, or Firm* — Procopio, Cory, Hargreaves & Savitch LLP

(57) ABSTRACT

A semiconductor device for evaluating characteristics of a transistor is provided. The semiconductor device includes a substrate, an active area defined on the substrate, an insulated gate configured to be formed on the active area, a first source layer and a first drain layer configured to be formed on the active area in a first two-way direction of the gate, and a second source layer and a second drain layer configured to be formed on the active area in a second two-way direction of the gate. The first source layer, the first drain layer, and the second drain layer are formed as a first conductive type. The second source layer is formed as a second conductive type.

7 Claims, 8 Drawing Sheets

(51) Int. Cl.
*H01L 21/66* (2006.01)
*H01L 29/66* (2006.01)
*H01L 29/78* (2006.01)
*G01R 31/26* (2020.01)

(52) U.S. Cl.
CPC ............ H01L 22/34 (2013.01); H01L 23/528 (2013.01); *H01L 27/092* (2013.01); *H01L 29/66977* (2013.01); *H01L 29/78* (2013.01)

(56) References Cited

U.S. PATENT DOCUMENTS

| | | | |
|---|---|---|---|
| 2006/0049436 A1* | 3/2006 | Schnabel | H01L 21/765 257/288 |
| 2007/0178650 A1* | 8/2007 | Chen | H01L 29/165 438/301 |
| 2009/0101975 A1* | 4/2009 | Holz | H01L 27/0886 257/347 |
| 2014/0124827 A1 | 5/2014 | Holz et al. | |
| 2014/0252442 A1* | 9/2014 | Chuang | H01L 21/823487 257/306 |
| 2018/0061994 A1* | 3/2018 | Shi | H01L 29/78651 |
| 2019/0148560 A1* | 5/2019 | Cho | H01L 29/7883 257/51 |
| 2020/0098867 A1* | 3/2020 | Li | H01L 29/7831 |

FOREIGN PATENT DOCUMENTS

| | | | |
|---|---|---|---|
| KR | 100575002 B1 | 4/2006 | |
| KR | 100575002 B1 | 5/2006 | |

\* cited by examiner

SEMICONDUCTOR DEVICE FOR TESTING CHARACTERISTICS OF TRANSISTORS AND METHOD FOR TESTING SEMICONDUCTOR DEVICE

CROSS-REFERENCE TO RELATED APPLICATIONS

This application claims priority under 35 U.S.C. § 119 to Korean Patent Application No. 10-2017-0161803 filed on Nov. 29, 2017 and No. 10-2018-0006979 filed on Jan. 19, 2018, in the Korean Intellectual Property Office, the disclosures of which are incorporated by reference herein in their entireties.

BACKGROUND

Embodiments of the inventive concept described herein relate to semiconductor devices, and more particularly, relate to methods for testing characteristics of semiconductor devices.

Today, semiconductor technology is used as wide as it is applied to almost all of things around us. There is a metal oxide semiconductor field effect transistor (MOSFET) which is the most frequently used device among a large number of semiconductor transistors. However, power consumption increases greatly as semiconductor integration according to Moore's Law increases and as an operating speed is enhanced, so MOSFET devices have reached the limit of being used as low-power devices. Research has been conducted in a tunneling field effect transistor (TFET) using band-to-band tunneling as an alternative to the MOSFET. The MOSFET operates on the principle where carriers receive energy greater than or equal to an energy barrier and crosses the barrier, whereas the TFET operates on the principle where electrons tunnel from a valence band to a conduction band such that current flows. In other words, the TFET is advantageous to reduce a standby current as much as using tunneling. However, reliability evaluation should be preceded prior to using the TFET. The reliability is defined as an evaluation index which represents how long products or components are used safely and conveniently without failure while consumers use the products or components as a quantitative measure. It is required to accurately evaluate and analyze reliability characteristics. Thus, when a TFET is used, reliability evaluation is required in advance.

SUMMARY

Embodiments of the inventive concept provide a device which may be used as a tunneling field effect transistor (TFET) or a metal oxide semiconductor field effect transistor (MOSFET) depending on a voltage applying scheme.

Embodiments of the inventive concept provide a device for applying intentional stress to a semiconductor device, evaluating detailed characteristics and reliability of a TFET, and analyzing performance of the TFET.

According to an exemplary embodiment, a semiconductor device may include a first transistor configured to be driven in a first mode and a second transistor configured to be driven in a second mode different from the first mode. The first transistor and the second transistor may share the same channel layer.

According to an exemplary embodiment, a semiconductor device may include a substrate, an active area defined on the substrate, an insulated gate configured to be formed on the active area, a first source layer and a first drain layer configured to be formed on the active area in a first two-way direction of the gate, and a second source layer and a second drain layer configured to be formed on the active area in a second two-way direction of the gate. Each of the first source layer, the first drain layer, and the second drain layer may be formed as a first conductive type. The second source layer may be formed as a second conductive type.

The semiconductor device may further include a first source electrode, a first drain electrode, a second source electrode, and a second drain electrode configured to be electrically connected with the first source layer, the first drain layer, the second source layer, and the second drain layer, respectively.

Each of the first source electrode, the first drain electrode, the second source electrode, and the second drain electrode may include a first electrode member configured to be electrically connected with a corresponding source layer and drain layer formed on the active area and be extended horizontally outward from the semiconductor device, a first electrode pad configured to be formed on a location which is not adjacent to the first electrode member, and a second electrode member configured to be electrically connected with one end of the first electrode member and one end of the first electrode pad and have a width narrower than the first electrode member and the first electrode pad.

The insulated gate may be formed larger in width than the active area where the first source layer, the first drain layer, the second source layer, and the second drain layer are formed.

The semiconductor device may further include a controller configured to have a first mode for forming a first channel between the first source layer and the first drain layer in the active area and have a second mode for forming a second channel between the second source layer and the second drain layer in the active area. The first channel and the second channel may be selectively formed.

According to an exemplary embodiment, a method for testing a semiconductor device may include verifying whether the semiconductor device is driven, applying stimulation for forming stress on a surface between at least one of a first source layer, a first drain layer, a second source layer, and a second drain layer and a gate insulating layer to the semiconductor device, and evaluating performance of a tunneling field effect transistor (TFET), after the stress is formed on the surface.

The applying of the stimulation to the semiconductor device may include at least one of applying voltage for degrading the surface to a gate layer and heating the semiconductor device at a temperature for degrading the surface.

The evaluating of the performance of the tunneling field effect transistor (TFET) may be performed using a manner to evaluate performance of a metal oxide semiconductor field effect transistor (MOSFET).

According to an exemplary embodiment, a semiconductor test pattern may include a substrate, an active area of a cross form, the active area being defined on the substrate, a gate configured to be located on a central portion of the active area, a gate insulating film configured to be located between the gate and the central portion of the active area, and four impurity regions formed on the active area outside the gate. Any one of the four impurity regions may be formed as a first conductive type. Each of the other impurity regions may be formed as a second conductive type.

The gate may be formed larger in width than the active area where the impurity are formed.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
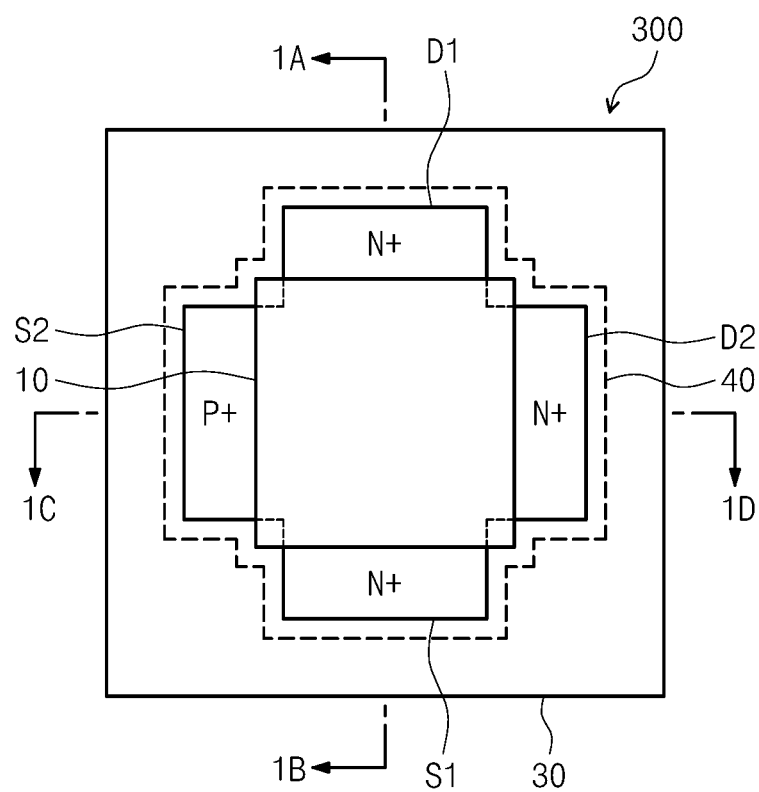
FIG. 1 is a plan view illustrating an embodiment of a semiconductor device sharing a channel layer in the inventive concept.

Hereinafter, embodiments of the inventive concept are described for clarity and in detail so that this disclosure will be thorough and complete and will fully convey the scope of the inventive concept to those skilled in the art. However, the inventive concept is not limited by embodiments disclosed hereinafter, and may be implemented in various forms. Furthermore, in describing an exemplary embodiment of the inventive concept in detail, when it is determined that a detailed description of related well-known functions or components unnecessarily blurs the gist of the inventive concept, the detailed description will be omitted. Furthermore, the same reference numerals and denotations are used for portions for performing similar functions and operations throughout the accompanying drawings.

In addition, throughout the specification, when an element is referred to as being "connected" to another element, the element may be "directly connected" to the other element with one or more intervening elements interposed in between.

Unless explicitly described to the contrary, the expression "comprising any element" will be understood to imply the further inclusion of other elements but not the execution of the other elements. In detail, it should be understood that the terms "comprises," "comprising," "includes," "including," "have," or "having" when used in this specification, specify the presence of features, integers, steps, operations, elements, or components stated on the specification, but do not preclude the presence or addition of one or more other features, integers, steps, operations, elements, components, and/or groups thereof.

Although the terms "first" and "second" may be used herein to describe various elements, these elements should not be limited by these terms. These terms are only used to distinguish one element from the other. For example, a first element may be named a second element without departing from the scope and sprit of the inventive concept. Likewise, a second element may be named a first element.

The singular expression may include plural expressions unless otherwise specified. Furthermore, in the drawings, the shapes and sizes of elements may be exaggerated for clarity.

The term "unit" used throughout the specification may refer to a unit of processing at least one function or operation. For example, the term "unit" used herein may refer to software or a hardware element such as a field programmable gate array (FPGA) or an application specific integrated circuit (ASIC). However, it does not mean that the term "unit" used herein is limited to software or hardware. The term "unit" used herein may be constituted to exist in an addressing-possible storage medium, or may be constituted to regenerate one or more processors.

As an example, the term "unit" used herein may include elements, such as software elements, object-oriented software elements, class elements, and task elements, processes, functions, attributes, procedures, sub-routines, segments of a program code, drivers, firmware, a microcode, a circuit, data, a database, data structures, tables, arrays, and variables. Elements and functions provided in "unit" may be separated and performed by a plurality of elements and "units", or may be integrated with other additional elements.

The inventive concept relates to a semiconductor device, and more particularly, relates to a semiconductor device which has problem-solving principles of sharing a channel of a transistor driven in a second mode different from a first mode with a transistor driven in the first mode. The semiconductor device may operate as the transistor driven in the first mode and the transistor driven in the second mode in one device, respectively, using structural characteristics in which a channel region of the transistors is shared. Furthermore, a manner to evaluate characteristics of the transistor driven in the first mode may be used to evaluate characteristics of the transistor driven in the second mode. The problem-solving principles of the semiconductor device sharing a channel according to an embodiment of the inventive concept may also be applied when there are a plurality of source layers and drain layers facing each other. Moreover, the problem-solving principles of the semiconductor device may also be applied when the shared channel region is formed at several angles, other than when it should be vertically formed.

Hereinafter, a description will be given of an exemplary embodiment of the inventive concept.

In FIG. 1, a plan view of a semiconductor device 300 according to an embodiment of the inventive concept is illustrated. Referring to FIG. 1, the semiconductor device 300 according to an embodiment of the inventive concept may include a substrate 30, an active area 40 defined on the substrate 30 and a gate 10 formed on the active area 40, and a first source layer S1 and a first drain layer D1 formed on the active area 40 in a first two-way direction of the gate 10. The semiconductor device 300 may further include a second source layer S2 and a second drain layer D2 formed on the active area 40 in a second two-way direction of the gate 10. The semiconductor device 300 may have a feature which shares a channel layer between the first source layer S1 and the first drain layer D1 and a channel layer between the second source layer S2 and the second drain layer D2. The first two-way direction of the gate 10 may be an x-axis direction. The second two-way direction of the gate 10 may be a direction orthogonal to the first two-way direction, that is, a y-axis direction. The active area 40 may be formed in the form of a cross. The first source layer S1, the first drain layer D1, or the second drain layer D2 may be formed as a first conductive type, and the second source layer S2 may be formed as a second conductive layer.

Figure 2A:
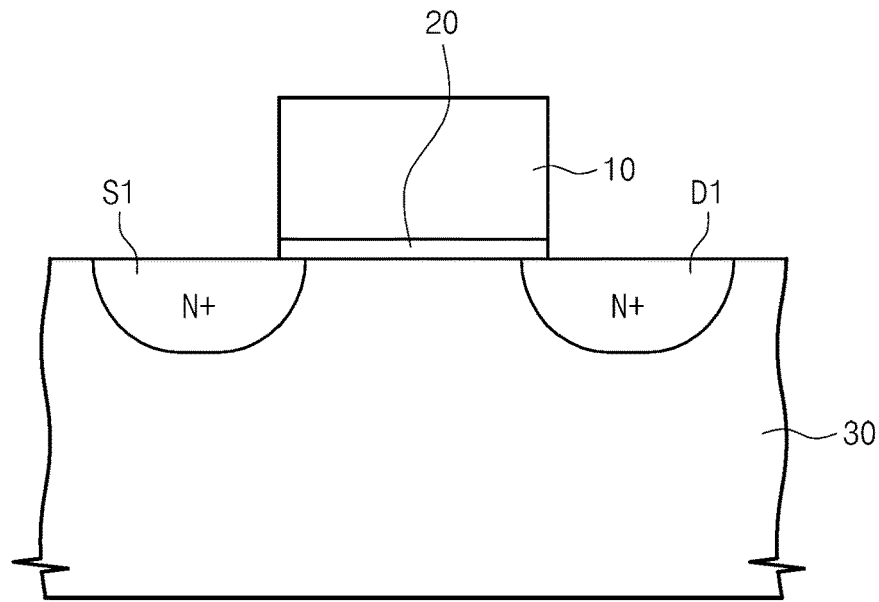
FIGS. 2A and 2B are cross-sectional views of a semiconductor device of FIG. 1, taken along axes 1A-1B and 1C-1D.
Figure 2B:
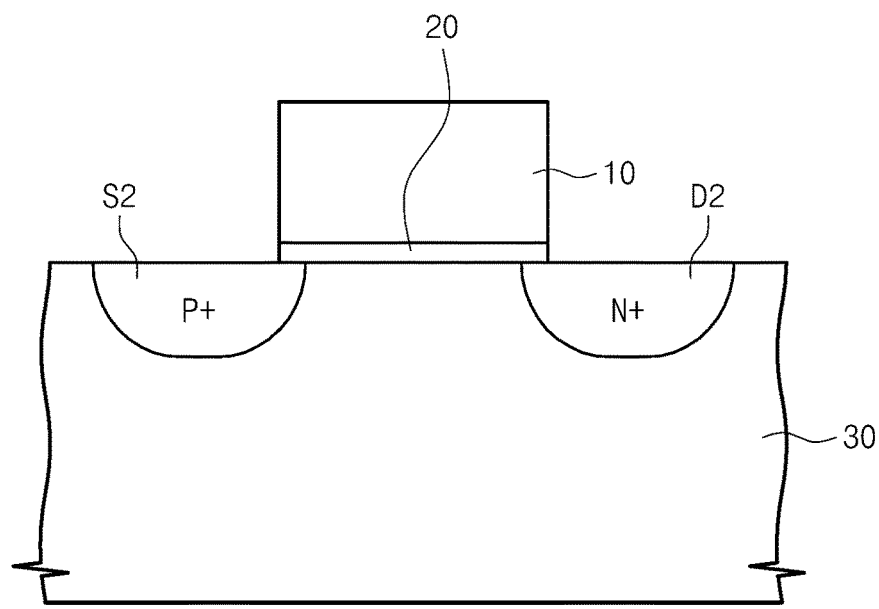

FIGS. 2A and 2B are cross-sectional views of a semiconductor device of FIG. 1, taken along axes 1A-1B and 1C-1D. A description will be given of a cross-sectional view of the semiconductor device, taken along axis 1A-1B, and a cross-sectional view of the semiconductor device, taken along axis 1C-1D, with reference to FIGS. 2A and 2B.

Referring to FIG. 2A, a semiconductor device 300 of FIG. 1 may include a first source layer S1 formed as n-type and a first drain layer D1 formed as n-type. The semiconductor device 300 may further include an insulating film 20 and a gate 10 which are formed to cover a part of an active area 40 on which the first source layer S1 and the first drain layer D1 are formed. When a gate voltage is applied to the gate 10 via a gate electrode and when a proper voltage is applied to the first source layer S1 and the first drain layer D1, a channel layer may be formed in the active area 40 below the insulating film 20 between the first source layer S1 and the first drain layer D1 such that current flow. In other words, the semiconductor device 300 of FIG. 2A may be driven as a metal oxide silicon field effect transistor (MOSFET).

Referring to FIG. 2B, the semiconductor device 300 may include a second source layer S2 formed as p-type and a second drain layer D2 formed as n-type. The semiconductor device 300 may further include an insulating film 20 and a gate 10 which are formed to cover a part of the active area 40 on which the second source layer S2 and the second drain layer D2 are formed. When a gate voltage is applied to the gate 10 via a gate electrode and when a proper voltage is applied to the second source layer S2 and the second drain layer D2 of the semiconductor device 300, a channel layer may be formed in the active area 40 below the insulating film 20 between the second source layer S2 and the second drain layer D2 such that electrons move in a tunneling scheme since an energy level of the active area 40 is changed, so current may flow. In other words, the semiconductor device 300 of FIG. 2B may be driven as a tunneling field effect transistor (TFET).

Figure 3:
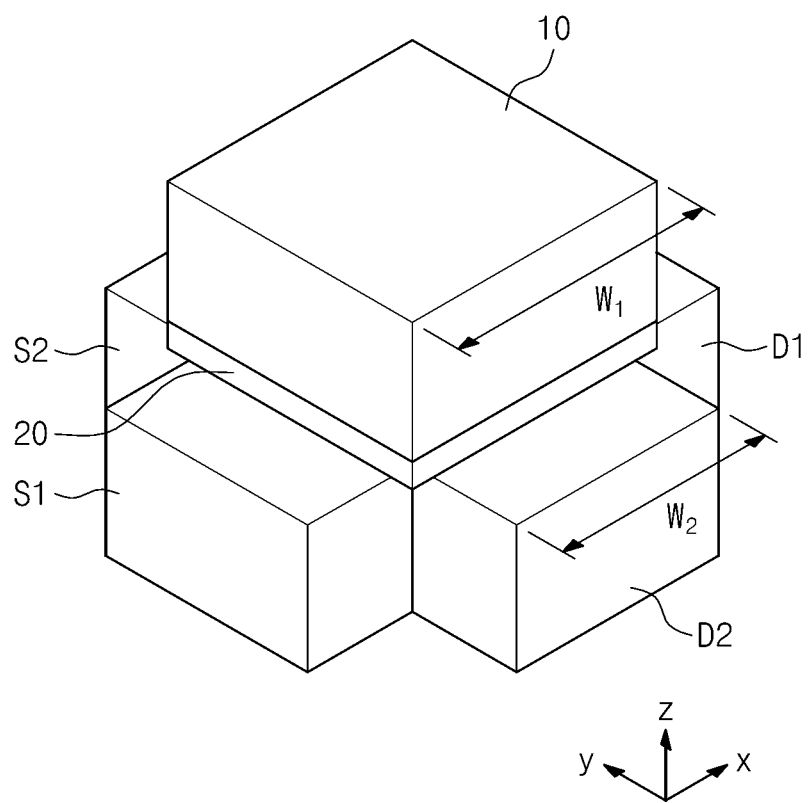
FIG. 3 is a perspective view illustrating a semiconductor device according to an embodiment of the inventive concept.

FIG. 3 is a perspective view illustrating a semiconductor device according to an embodiment of the inventive concept. Referring to FIG. 3, a view illustrating a semiconductor device 300 in three dimensions is provided. To prevent a short circuit, a gate 10 may be formed larger in width than an active area. $W_1$ shown in FIG. 3 denotes the width of the gate 10, and $W_2$ shown in FIG. 3 denotes the width of the active area. In other words, a value of $W_1$ may be larger than a value of $W_2$. Although the width of the gate 10 is not considered in size, a gate size margin may be designed to preferably have a value of a minimum of 0.1 um. In other words, a value of $(W_1-W_2)/2$ may be a minimum of 0.1 um.

In detail, contrary to a typical transistor, two transistors in the semiconductor device 300 according to an embodiment of the inventive concept may share a channel, and the semiconductor device 300 may include two pairs of impurity regions, a pair of impurity regions of which become a source and a drain. In an ion implantation process when fabricating a semiconductor device according to an embodiment of the inventive concept, the semiconductor device may have a feature which shares a gate and a channel layer, so there may be a probability that impurities will come into contact with each other when the semiconductor device is designed too small, or there may be a probability that diffusion will occur due to a difference between electron concentration distributions. When diffusion occurs, a channel may not be formed properly, so the semiconductor device may lose its function.

Thus, to prevent a short circuit, the gate 10 may be formed large enough so that a MOSFET and a TFET may be driven properly.

A substrate 30 may include any suitable semiconductor material, for example, silicon (Si), germanium (Ge), silicon germanium (SiGe), indium arsenide (InAs), germanium tin (GeSn), silicon germanium tin (SiGeSn), or any other III-V or II-VI compound semiconductors.

The substrate 30 may be doped, undoped or contain both doped and undoped regions therein. The substrate 30 may also include one or more doped (n- or p-) regions. When the substrate 30 includes multiple doped regions, these regions may be the same, or they may have different conductivities and/or doping concentrations. These doped regions are known as "wells" and may be used to define various device regions.

It is preferable to deposit materials with high permittivity, for example, aluminum oxide ($Al_2O_3$) or the like which is metal oxide, in an atomic layer deposition (ALD) technique to form an insulating film 20 using a shallow trench isolation (STI) process or a boron phosphorus silicate glass (BPSG) process.

The gate 10 deposited on the insulating film 20 may be preferable to be formed of metal, for example, may be formed by depositing aluminum, titanium, or the like.

In an embodiment, the semiconductor device 300 may be designed in various styles depending on whether a first source layer S1, a first drain layer D1, or a second drain layer D2 is formed as a first conductive type or a second conductive type. Each of the first conductive type and the second conductive type may be n-type or p-type. Hereinafter, a description will be in detail.

When a p-region is included in an n-type substrate, when the first source layer S1, the first drain layer D1, or the second drain layer D2 is formed as n-type, and when the second source layer S2 is formed as p-type, the semiconductor device 300 may be designed as an nMOSFET or pTFET according to a voltage applying scheme. As another example, when an n-region is included in a p-type substrate, when the first source layer S1, the first drain layer D1, or the second drain layer D2 is formed as p-type, and when the second source layer S2 is formed as n-type, the semiconductor device 300 may be designed as a pMOSFET or nTFET according to the voltage applying scheme.

Figure 4:
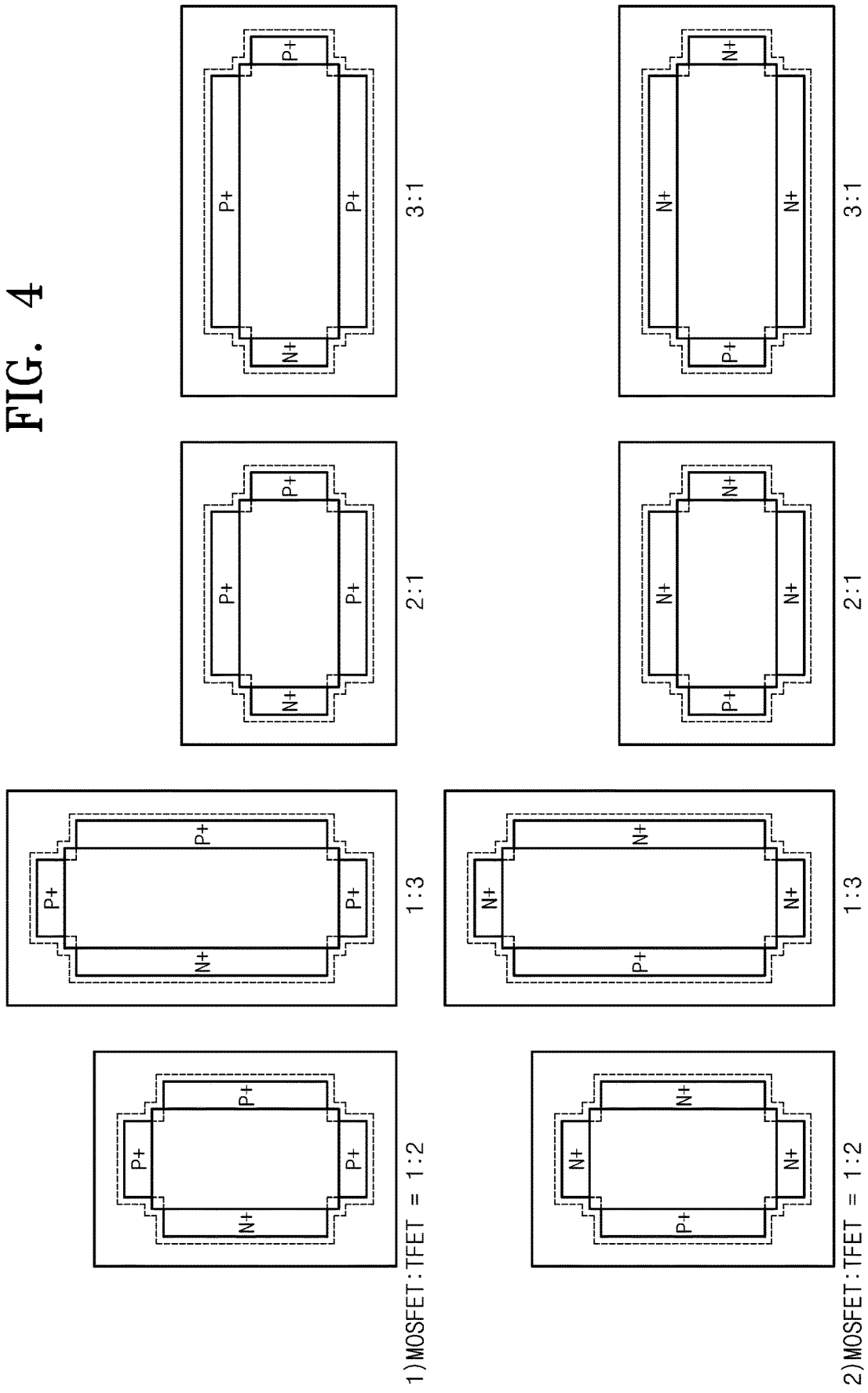
FIG. 4 is a view illustrating a semiconductor device having gates with various horizontal-to-vertical ratios according to another embodiment of the inventive concept.

FIG. 4 is a view illustrating a semiconductor device having gates with various horizontal-to-vertical ratios according to another embodiment of the inventive concept. A description will be given of another embodiment of a semiconductor device of the inventive concept with reference to FIG. 4. The ratio of a horizontal length to a vertical length of a gate of a MOSFET or a TFET is not a fixed value. Thus, a design is possible by changing the ratio of the horizontal length to the vertical length to several ratios. As shown in FIG. 4, an embodiment is exemplified as the ratio of the horizontal length to the vertical length of the gate is the ratio of an integer to an integer. However, embodiments are not limited thereto. For example, the ratio of the horizontal length to the vertical length of the gate is the ratio of a prime number to a prime number. In other words, a horizontal length of the gate 10 may correspond to a length of a channel formed between a first source layer S1 and a first drain layer D1 and a vertical length of the gate 10 may correspond to a length of a channel formed between a second source layer S2 and a second drain layer D2, so a length of a channel of a TFET and a MOSFET may be used by changing to various lengths.

Figure 5:
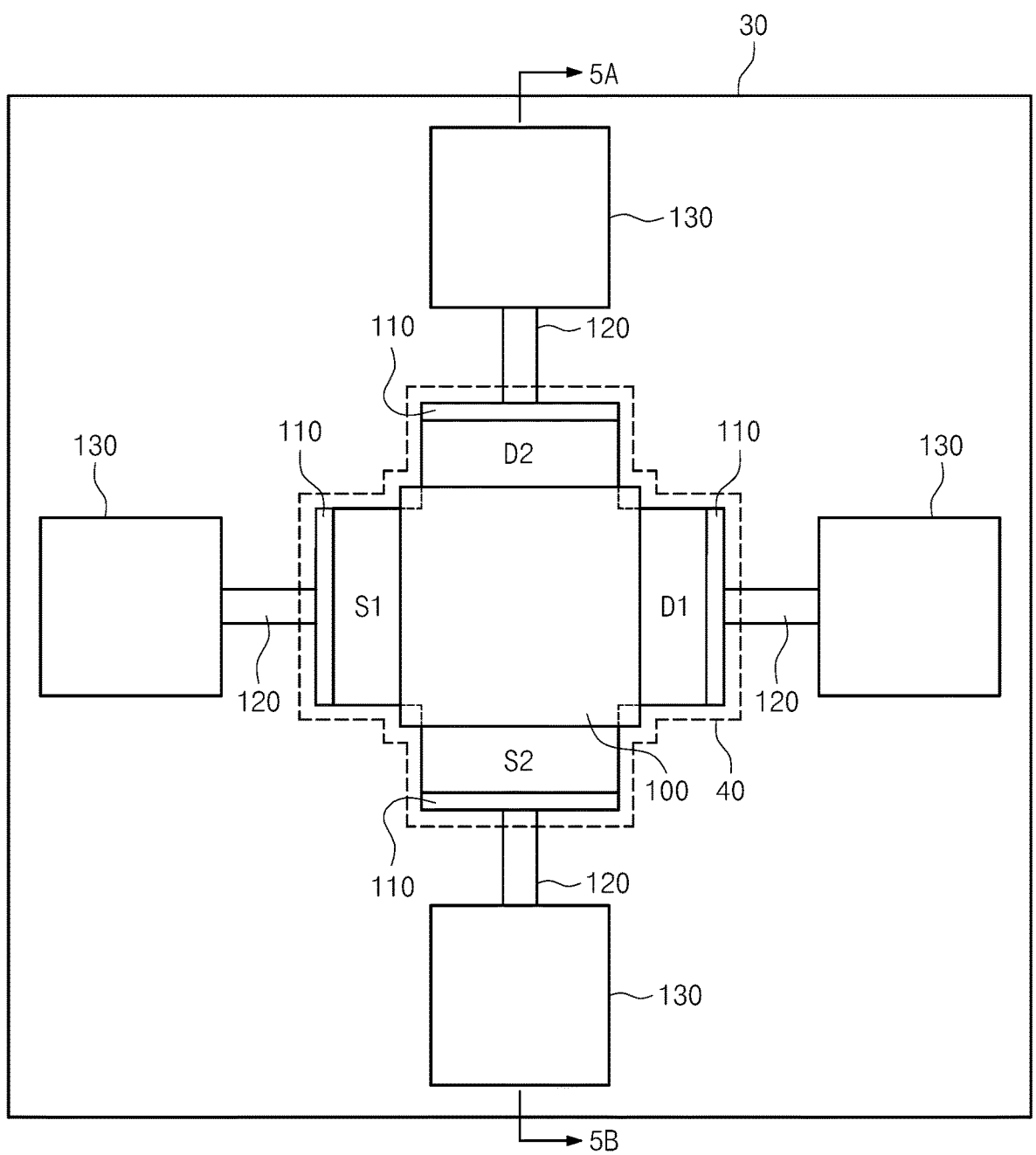
FIG. 5 is a plan view illustrating an embodiment for connecting electrodes to a semiconductor device according to the inventive concept.
Figure 6:
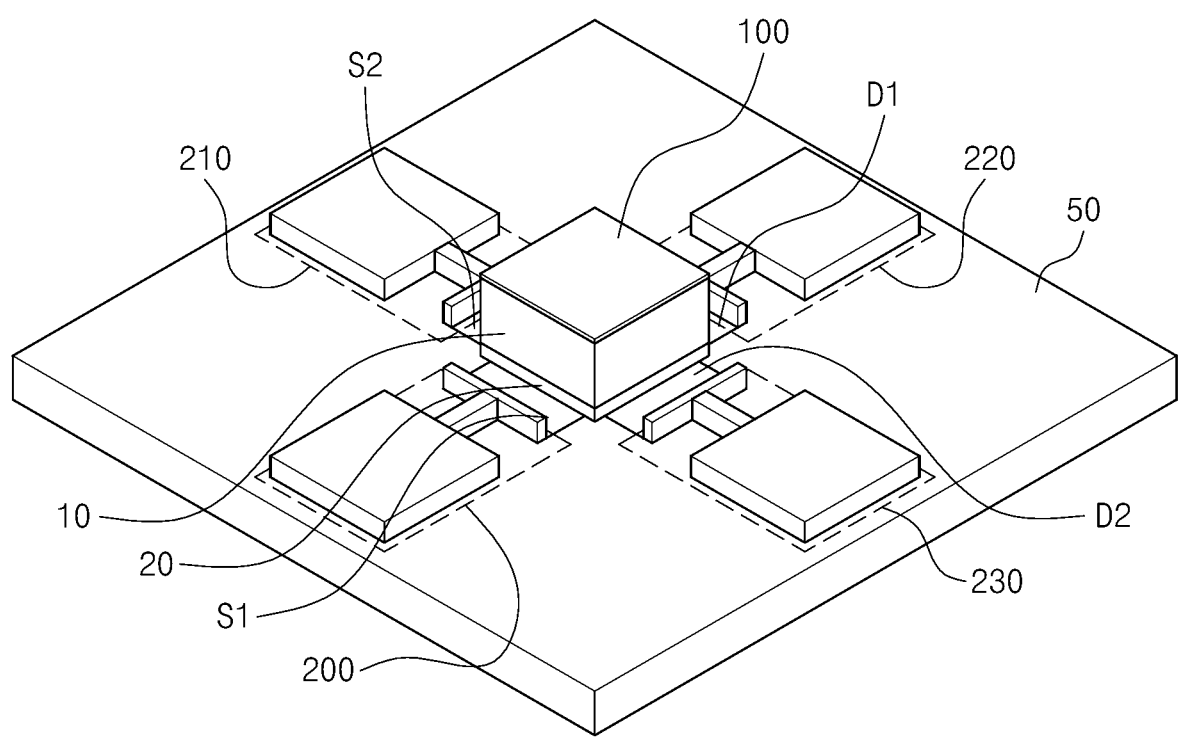
FIG. 6 is a perspective view illustrating a semiconductor device according to an embodiment of FIG. 5.

In FIG. 5, a plan view of a semiconductor device 300 having 5 electrodes is illustrated. In FIG. 6, a perspective view of the semiconductor device 300 of FIG. 5 is illustrated. A description will be given of a detailed embodiment of the semiconductor device 300 according to an embodiment of the inventive concept with reference to FIGS. 5 and 6. A semiconductor device may further include a first source electrode 200, a first drain electrode 220, a second source electrode 210, and a second drain electrode 230 in the semiconductor device 300 of FIG. 1. The first source electrode 200, the first drain electrode 220, the second source electrode 210, and the second drain electrode 230 may be electrically connected with a first source layer S1, a first drain layer D1, a second source layer S2, and a second drain layer D2, respectively.

Each of the first source electrode 200, the first drain electrode 220, the second source electrode 210, and the second drain electrode 230 may include a first electrode member 110, a first electrode pad 130, and a second electrode member 120. The first electrode member 110 may be electrically connected with a part of a corresponding source layer or a corresponding drain layer. The first electrode member 110 may be formed in an outward direction of the semiconductor device 300 and may be formed in the direction of being horizontally extended. The first electrode pad 130 to which voltage is actually applied may fail to come into direct contact with the first electrode member 110. The semiconductor device 300 may further include the second electrode member 120 which electrically connects the first electrode pad 130 with the first electrode member 110.

The second electrode member 120 may physically connect the first electrode pad 130 with the first electrode member 110 and may be formed in the direction of being extended outward from the semiconductor device 300. Furthermore, the second electrode member 120 may have a width narrower than a length of the first electrode pad 130 and the first electrode member 110. The second electrode member 120 may connect the first electrode pad 130 with the first electrode member 110 using its narrow width to prevent a short circuit from occurring between the first electrode member 110 and the first electrode pad 130. The second electrode member 120 may be formed to be as long as a short circuit does not occur between the first electrode member 110 and the first electrode pad 130. Furthermore, the first electrode pad 130 may be laid out to be far apart from the first electrode member 110 to prevent a short circuit. Thus, a short circuit problem between a MOSFET and a TFET, which occurs because electrodes are close to each other, are solved, and there is no concern that the MOSFET and the TFET may be simultaneously driven after voltage is simultaneously applied to the MOSFET and the tunneling FET.

Figure 7:
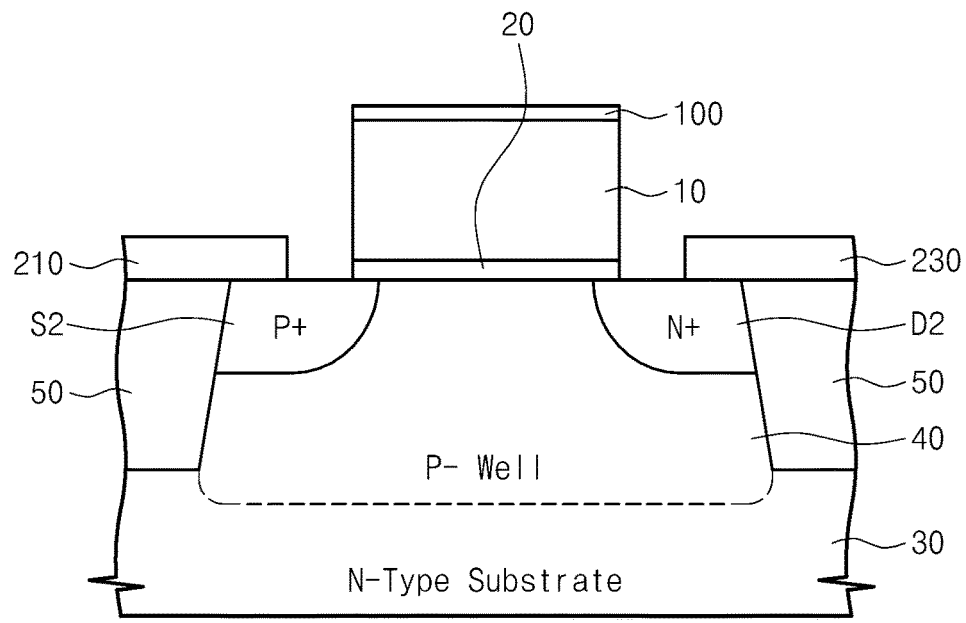
FIG. 7 is a cross-sectional view of a semiconductor device according to an embodiment of FIG. 5, taken along axis 5A-5B.

FIG. 7 illustrates a cross-sectional view of a semiconductor device of FIG. 5, taken along axis 5A-5B. An embodiment of a semiconductor device 300 illustrates a TFET including an n-type substrate, a p-well, a second source layer S2 formed as p-type, and a second drain layer D2 formed as n-type. The TFET may further include an insulating film 20, a gate 10, and a gate electrode 100 and may further include a second source electrode 210 and a second drain electrode 230. Furthermore, a part of the second source layer S2 and the second source electrode 210 and a part of the second drain layer D2 and the second drain electrode 230 may be connected to an STI insulating film 50. The second source electrode 210 may include a first electrode member 110, a first electrode pad 130, and a second electrode member 120. The first electrode member 110 may be located on a top end of the second source layer S2, and the first electrode pad 130 and the second electrode member 120 may be located on a top end of the STI insulating film 50.

Figure 8:
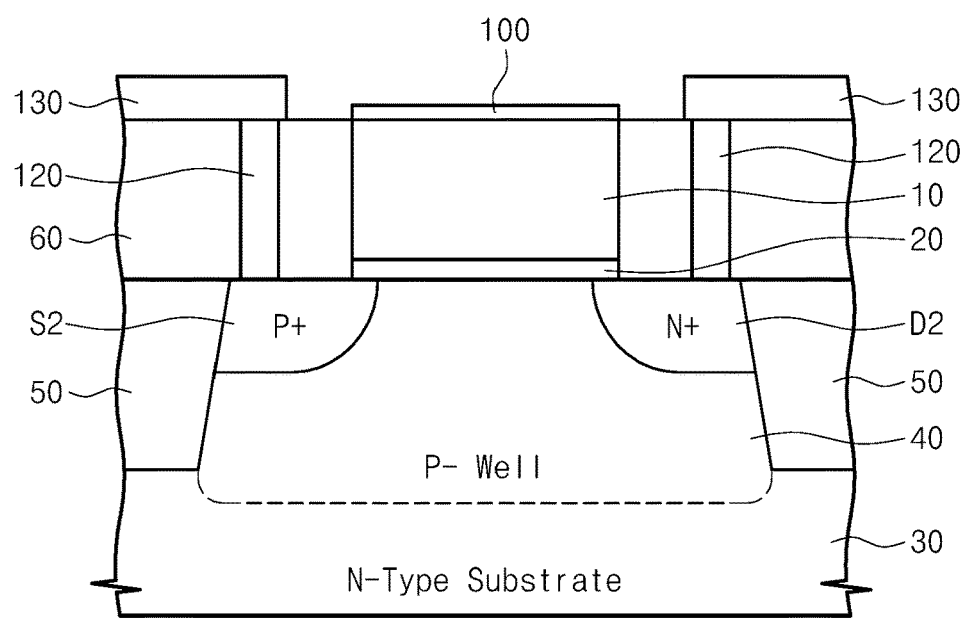
FIG. 8 is a cross-sectional view illustrating an embodiment for connecting electrodes to a semiconductor device according to the inventive concept in another manner.

FIG. 8 is a cross-sectional view illustrating an embodiment for connecting electrodes to a semiconductor device according to the inventive concept in another manner. A description will be given of another embodiment of a semiconductor device with reference to FIG. 8. In FIG. 7, a source electrode and a drain electrode may be configured horizontally. However, in FIG. 8, electrodes may be configured vertically using a back-end process. FIG. 8 is a cross-sectional view of a TFET vertically configuring array of electrodes in a cross-sectional view of a semiconductor device of FIG. 5, taken along axis 5A-5B. A first electrode member 110 may be formed in a semiconductor device 300 of FIG. 1 to be adjacent to a part of a corresponding source layer or a corresponding drain layer. After a BPSG insulating film 60 may be formed to the same height as a gate 10, a first electrode pad 130 to which voltage is actually applied may be configured to be located on a plane of the same location as a height where a gate electrode 100 is located. The first electrode pad 130 and the first electrode member 110 may be electrically connected with each other via a second electrode member 120 vertically located. An embodiment of the inventive concept may solve a problem resulting in relative deterioration in integration by locating electrodes to be horizontally wide in FIG. 7.

The semiconductor device 300 according to an embodiment of the inventive concept may further include a controller having a first mode for forming a first channel in an active area 40 between a first source layer S1 and a first drain layer D1 and a second mode for forming a second channel in the active area 40 between a second source layer S2 and a second drain layer D2. The first mode may be a mode where the semiconductor device 300 is driven as a MOSFET, and the second mode may be a mode where the semiconductor device 300 is driven as a TFET.

The first channel may be a channel generated between the first source layer S1 and the first drain layer D1 such that current flows when voltage is applied to a gate electrode of the semiconductor device 300. The second channel may be a channel generated between the second source layer S2 and the second drain layer D2 since an energy level of an active area is changed, such that electrons move in a tunneling technique when voltage is applied to the gate electrode 100 of the semiconductor device 300.

The first channel and the second channel may be selectively formed and may fail to be driven simultaneously. In other words, in an embodiment, referring to FIGS. 1, 2A, and 2B, the semiconductor device 300 may be driven as the MOSFET of the first mode or the TFET of the second mode depending on a voltage driving scheme. In detail, a pulse voltage may be applied to the gate 10, and a second source electrode 210 or a second drain electrode 230 may float. When voltage is applied to a first source electrode 200 and a first drain electrode 220, the semiconductor device 300 may be driven as a MOSFET. In the same principle, a pulse voltage may be applied to the gate 10, and the first source electrode 200 or the first drain electrode 200 may float. When voltage is applied to the second source electrode 210 and the second drain electrode 230, the semiconductor device 300 may be driven as a TFET.

Hereinafter, in another aspect of the inventive concept, a description will be given of a method for testing a semiconductor device. To enhance a probability that a TFET will be driven, there should be a high probability that electrons will tunnel from a valence band of a source to a conduction band of a drain. In this case, the probability that the electrons will tunnel may vary with characteristics of a gate oxide and characteristics of a surface between the gate oxide and a channel. Thus, an embodiment of the inventive concept may provide a device which generates a defect in the surface by artificially applying electrical stress and analyzes a correlation between surface characteristics and performance.

Figure 9:
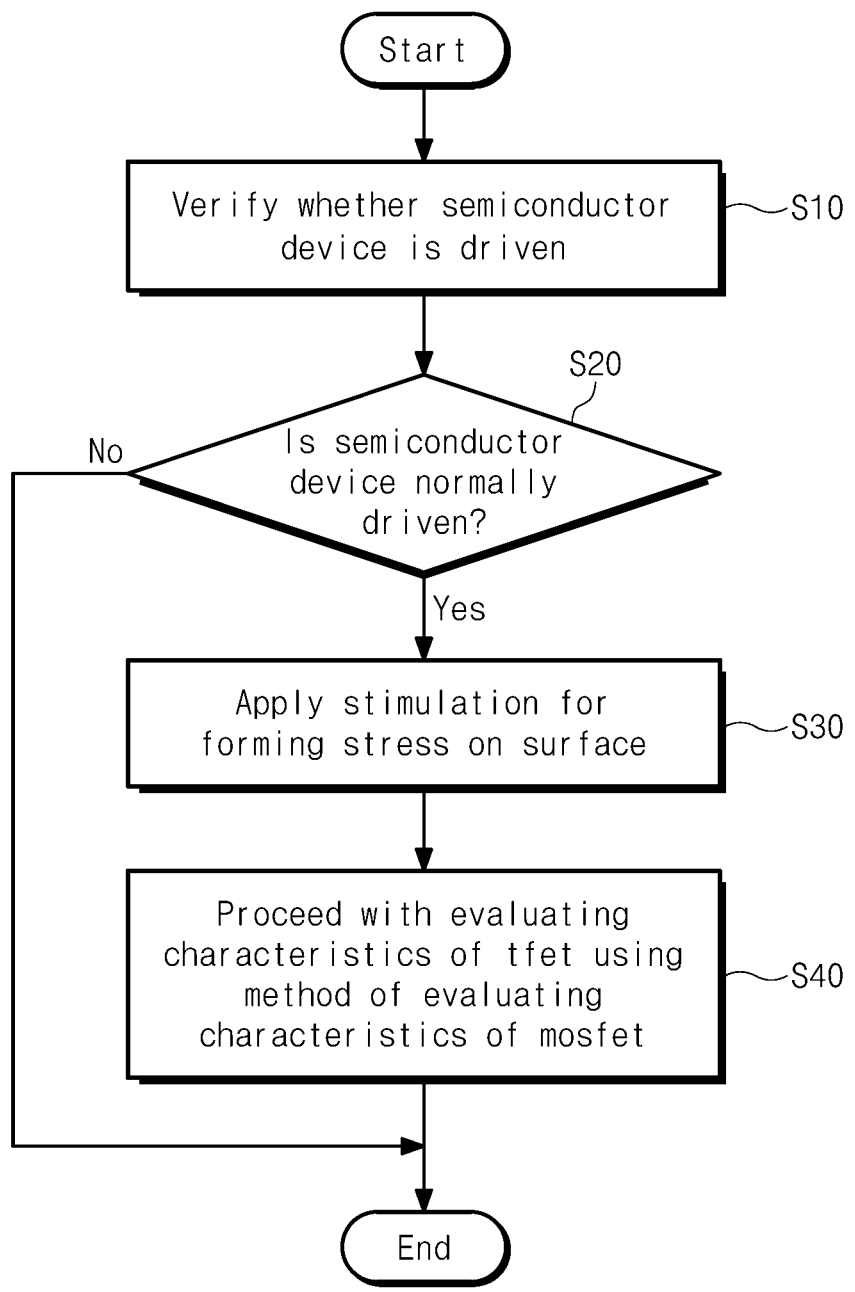
FIG. 9 is a flowchart illustrating a method for testing a semiconductor device according to an embodiment of the inventive concept.

Referring to FIG. 9, a method for testing a semiconductor device is schematically illustrated. Hereinafter, a description will be given of respective operations with reference to FIG. 9.

An operation which should be preceded in an operation of evaluating characteristics of a semiconductor device 300 of FIG. 1 may be an operation (S10) of verifying whether the semiconductor device 300 is driven. It may be verified how long the semiconductor device 300 is stably usable when the semiconductor device 300 is normally operated, so it should be determined whether the semiconductor device 300 is driven prior to reliability evaluation. The verification whether the semiconductor device 300 is driven may be performed using a manner to evaluate i-v characteristics. When a MOSFET and a TFET of the semiconductor device 300 are normally driven in operation S20, a next operation may proceed to operation S30. When the semiconductor device 300 is not driven normally, the test may be ended.

In next operation S40, a gate 10 of FIG. 1 may be degraded and characteristics and reliability of the TFET may be evaluated using a manner to evaluate characteristics of the MOSFET. When a constant voltage or a constant current is directly applied to a common gate electrode, a defect may occur in a gate oxide. Such a defect is electrified, so it may have an influence on driving a device. Deterioration in driving a device may be known by a change in saturation current or threshold voltage, deterioration in gate oxide may be known by a change in gate leakage current.

A characteristic evaluation test on the market is applied to a MOSFET. The test applied to the MOSFET may be applied to a TFET sharing a gate, so performance of the TFET may be evaluated and a device may be analyzed.

In an embodiment, the method of degrading the gate 10 of the semiconductor device 300 may be a method using hot carrier. Alternatively, the method of degrading the gate 10 of the semiconductor device 300 may be a method of applying high-temperature stimulation using a bias temperature instability (BTI) method. Alternatively, time dependent dielectric breakdown (TDDB) may also be used as the method of degrading the gate 10 of the semiconductor device 300.

In an embodiment, channel hot carrier (CHC) and drain avalanche hot carrier (DAHC) may be mainly used as the method using the hot carrier.

The CHC may be degradation using electrons captured using a trap in the oxide over the oxide, the electrons having large energy after some of electrons passing through a channel by an electric field held on both ends of the channel accelerate without probabilistically colliding with a lattice and may use a condition in which a gate voltage and a drain voltage are set to be equal to each other. In the DAHC, electrons which accelerate by an electric field applied between a drain and a substrate at a drain end and obtains energy may collide with a lattice, so an electron-hole pair may be generated. When there is maximum impact ionization (Vg to Vd/2), the DAHC may represent the highest degradation characteristics.

In an embodiment of the inventive concept, when the CHC is used, a gate voltage for degrading the semiconductor device 300 may be 4.2 V, 4.4 V, or 4.6 V and a drain voltage may be 4.2 V, 4.4 V, or 4.6 V.

In an embodiment of the inventive concept, when the DAHC is used, a gate voltage for degrading the semiconductor device 300 may be 2 V and a drain voltage may be 4.2 V, 4.4 V, or 4.6 V.

In detail, high energy carrier named hot carrier may be generated by a high channel electric field near a drain of a MOSFET device. The hot carrier may transmit energy to a silicon lattice through phonon emission and may destroy the coupling in a silicon/silicon oxide surface. In other words, since the hot carrier is generated by the high channel electric field near the drain of the MOSFET device, driving a MOSFET of the semiconductor device 300 according to an embodiment of the inventive concept and generating hot carrier may have an influence on a TFET sharing the gate 10 of the semiconductor device 300. Thus, it is an object of the inventive concept to evaluate how performance of the TFET influenced by such hot carrier is.

A description will be given of another degradation scheme of the semiconductor device 300 according to an embodiment of the inventive concept. An electrochemical reaction which generates degradation of a device may greatly depend on an electric field perpendicular to the gate and a stress temperature, so negative bias thermal instability (NBTI) evaluation may be executed at a high temperature. In an embodiment of the inventive concept, applying an NBTI stress of a pMOSFET may be performed by grounding a first source electrode 200, a first drain electrode 220, and a substrate 30 at a high temperature and applying a negative voltage to a gate electrode 100 of the pMOSFET. Performance degradation by NBTI may generally be measured in a condition where temperature is 100 to 300° C. and where a gate oxide electric field is less than or equal to 6 MV/cm. When an NBTI test is in progress, as a stress time increases, ΔVth may increase. This is because a trap occurs continuously while stress is applied. Furthermore, as a gate voltage increases, ΔVth may greatly increase. This is because an electric field in a vertical direction increases as the gate voltage increases.

In an embodiment of the inventive concept, after degradation proceeds by the above-mentioned methods, characteristics of current which flows according to a state of the semiconductor device 300, that is, DC characteristics of the semiconductor device 300 may be analyzed. In an embodiment of the inventive concept, characteristics of a TFET may be evaluated using a manner to evaluate characteristics of a MOSFET. The method of evaluating the characteristics of the MOSFET may be a method of measuring a threshold voltage. Alternatively, the method of evaluating the characteristics of the MOSFET may be a method of measuring carrier mobility. Furthermore, the method of evaluating the characteristics of the MOSFET may be a method of measuring a direct-current current-voltage (DCIV). In addition, the method of evaluating the characteristics of the MOSFET may be a method of measuring a gradient value, a leakage current, or the like in a threshold voltage or less.

In a semiconductor device influenced by the hot carrier, a threshold voltage may be increased by the hot carrier and transconductance and a drain current may be decreased, thus resulting in reduced device performance. Change rates of the above three variables may be measured over time when stress is applied, and characteristic evaluation may proceed using a manner to extract an operating time in an operating voltage.

In an embodiment of the inventive concept, a brief description will be given of only the method of measuring the threshold hold. In the method of measuring the threshold hold, when a low voltage less than 0.05 V is applied to a drain, the voltage may be extracted as a Vg value when a current of 100 nA per unit um flows in a drain end.

As a result, using an embodiment of the inventive concept, a surface of the gate oxide may be degraded through the above-mentioned variety of electrical stress, and thus linkage research may proceed.

Furthermore, other next-generation semiconductor devices as well as the TFET according to an embodiment of the inventive concept may evaluate reliability using such technologies.

There may be an effect capable of verifying quality of the oxide of the semiconductor device 300 according to an embodiment of the inventive concept.

According to an embodiment of the inventive concept, a device which shares a channel of the MOSFET and the TFET may be provided to be used as the MOSFET or the TFET depending on a voltage control scheme.

According to an embodiment of the inventive concept, characteristics of the TFET and the MOSFET may be analyzed under various conditions by adjusting a degradation level of the surface depending on a degree to which intentional stress is applied.

According to another embodiment of the inventive concept, the reliability of the TFET may be evaluated by applying the manner to evaluate the characteristics of the MOSFET to the TFET. The inventive concept may be used to evaluate the reliability of a next-generation semiconductor device as well as the TFET.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A semiconductor device, comprising:
a first transistor configured to be driven in a first mode; and
a second transistor configured to be driven in a second mode different from the first mode,
wherein the first transistor and the second transistor share the same channel layer and the same gate, and
wherein the first transistor is a tunneling field effect transistor (TFET) and the second transistor is a metal oxide semiconductor field effect transistor (MOSFET).

2. A semiconductor device, comprising:
a substrate;
an active area defined on the substrate;
an insulated gate configured to be formed on the active area;
a first source layer and a first drain layer configured to be formed on the active area in a first two-way direction of the gate; and
a second source layer and a second drain layer configured to be formed on the active area in a second two-way direction of the gate,
wherein each of the first source layer, the first drain layer, and the second drain layer is formed as a first conductive type, and
wherein the second source layer is formed as a second conductive type,
wherein the first source layer and the first drain layer are driven as a metal oxide semiconductor field effect transistor (MOSFET),
wherein the second source layer and the second drain layer are driven as a tunneling field effect transistor (TFET).

3. The semiconductor device of claim 2, further comprising:
a first source electrode, a first drain electrode, a second source electrode, and a second drain electrode configured to be electrically connected with the first source layer, the first drain layer, the second source layer, and the second drain layer, respectively,
wherein each of the first source electrode, the first drain electrode, the second source electrode, and the second drain electrode comprises:
a first electrode member configured to be electrically connected with a corresponding source layer and drain layer formed on the active area and be extended horizontally outward from the semiconductor device;
a first electrode pad configured to be formed on a location which is not adjacent to the first electrode member; and
a second electrode member configured to be electrically connected with one end of the first electrode member and one end of the first electrode pad and have a width narrower than the first electrode member and the first electrode pad.

4. The semiconductor device of claim 2, wherein the insulated gate is formed larger in width than the active area where the first source layer, the first drain layer, the second source layer, and the second drain layer are formed.

5. The semiconductor device of claim 2, further comprising:
a controller configured to have a first mode for forming a first channel between the first source layer and the first drain layer in the active area and have a second mode for forming a second channel between the second source layer and the second drain layer in the active area,
wherein the first channel and the second channel are selectively formed.

6. A semiconductor test pattern, comprising:
a substrate;
an active area of a cross form, the active area being defined on the substrate;
a gate configured to be located on a central portion of the active area;
a gate insulating film configured to be located between the gate and the central portion of the active area; and
four impurity regions formed on the active area outside the gate,
wherein any one of the four impurity regions is formed as a first conductive type, and
wherein each of the other impurity regions is formed as a second conductive type,
wherein two of the other impurity regions are driven as a metal oxide semiconductor field effect transistor (MOSFET),
wherein the impurity region formed of the first conductive type and the impurity region formed the second conductive type are driven as a tunneling field effect transistor (TFET).

7. The semiconductor test pattern of claim 6, wherein the gate is formed larger in width than the active area where the impurity are formed.

* * * * *